United States Patent
Takagi

[19]

[11] Patent Number: 6,115,473
[45] Date of Patent: Sep. 5, 2000

[54] RECEIVING APPARATUS FOR DIGITAL BROADCASTING

[75] Inventor: Kotaro Takagi, Tokyo, Japan

[73] Assignee: Sony Corporation, Tokyo, Japan

[21] Appl. No.: 09/128,548

[22] Filed: Aug. 4, 1998

[30] Foreign Application Priority Data

Aug. 8, 1997 [JP] Japan .................................. 09-213772
Mar. 18, 1998 [JP] Japan .................................. 10-067547

[51] Int. Cl.[7] .................................................. H04H 5/00
[52] U.S. Cl. .............................. 381/2; 455/132; 375/332; 375/347
[58] Field of Search ........................ 381/2, 3, 4; 455/132, 455/133, 214, 313, 314, 334; 375/329, 332, 347, 316, 344, 345, 349; 370/208

[56] References Cited

U.S. PATENT DOCUMENTS

| | | | |
|---|---|---|---|
| 5,003,557 | 3/1991 | Fujiyama ..................................... | 381/2 |
| 5,584,051 | 12/1996 | Goken ....................................... | 455/68 |
| 5,761,190 | 6/1998 | Yamauchi et al. ....................... | 370/210 |
| 5,761,252 | 6/1998 | Iinuma ..................................... | 455/133 |
| 5,838,799 | 11/1998 | Cioffi et al. .................................. | 381/2 |
| 5,852,784 | 12/1998 | Ito et al. .................................. | 455/314 |
| 5,862,226 | 1/1999 | Cervini ....................................... | 381/2 |
| 5,878,089 | 3/1999 | Dapper et al. ........................... | 375/325 |
| 5,946,292 | 8/1999 | Tsujishita et al. ...................... | 375/326 |

FOREIGN PATENT DOCUMENTS

| | | | |
|---|---|---|---|
| 2058505 | 4/1991 | United Kingdom ............. | H03D 7/12 |
| WO 92/22154 | 12/1992 | WIPO ....................................... | 381/2 |
| WO 94/22232 | 9/1994 | WIPO ....................................... | 381/2 |

*Primary Examiner*—Forester W. Isen
*Assistant Examiner*—Xu Mei
*Attorney, Agent, or Firm*—Jay H. Maioli

[57] ABSTRACT

A receiving apparatus for receiving digital broadcasting of a first frequency band and frequency band has a local oscillation circuit for generating a first local oscillation signal, and a frequency conversion circuit for frequency-converting the first local oscillation signal to generate a second local oscillation signal. The received signal of the first frequency band is up-converted to a first intermediate frequency signal using one of the of first and second local oscillation signals, and the received signal of the frequency band is down-converted to the first intermediate frequency signal using the other of the first and second local oscillation signals. Further, the receiving apparatus has another local oscillation circuit for oscillating a local oscillation frequency used for frequency conversion of the first intermediate frequency signal to a second intermediate frequency signal, an A/D converter for A/D converting the second intermediate frequency signal, and an orthogonal demodulation circuit for extracting I-component data and Q-component data from the A/D converted signal and for digital-converting the data.

5 Claims, 7 Drawing Sheets

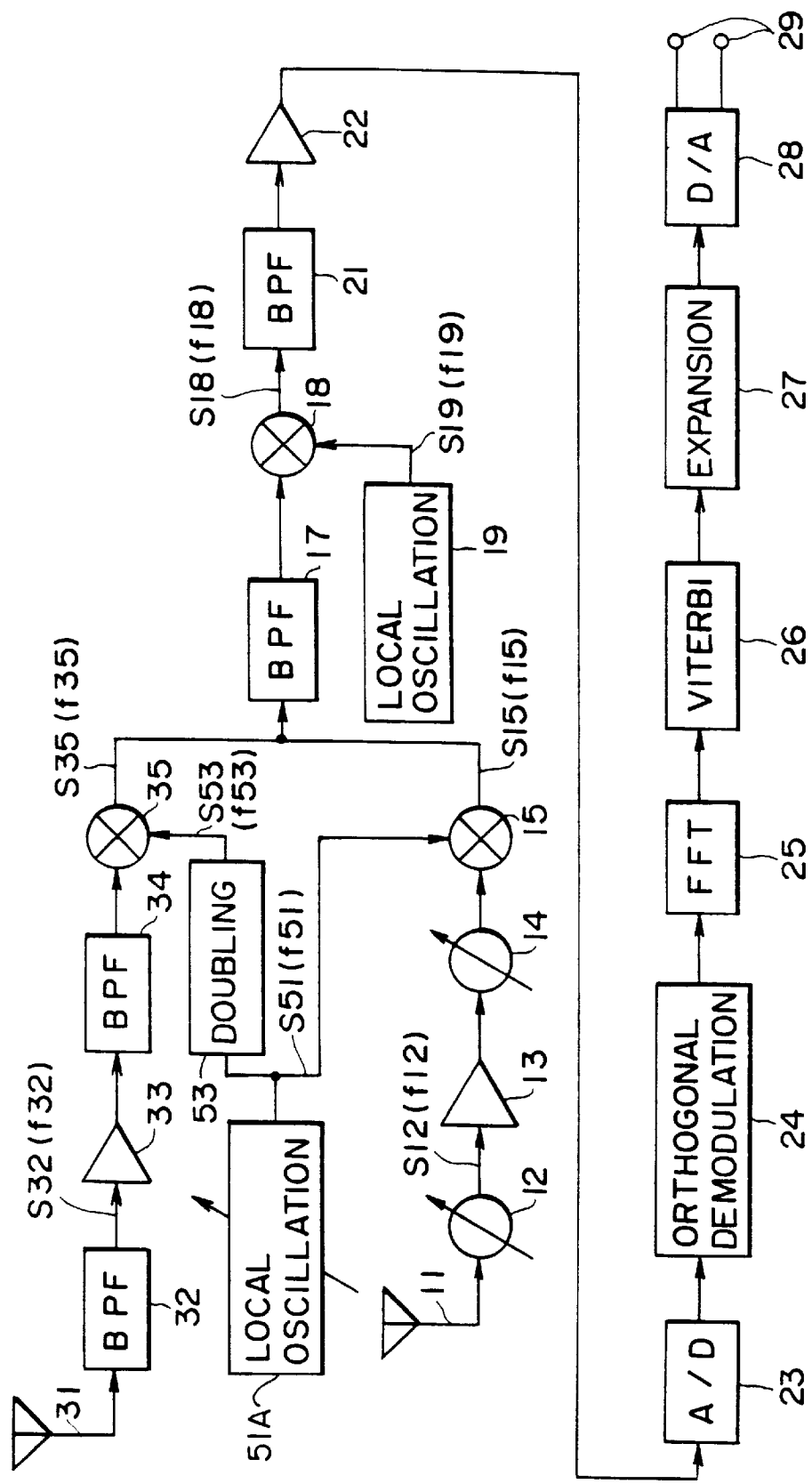

RECEIVING APPARATUS FOR DIGITAL BROADCASTING

BACKGROUND OF THE INVENTION

1. Field of the Invention

This invention relates to a receiving apparatus for receiving digital audio broadcasting.

2. Description of Related Art

DAB (Digital Audio Broadcasting) has been known as digital communication using phase modulation. The DAB is practically used according to EUREKA 147 standard in Europe, the signal processing on the transmission side is described herein under.

(1) A digital audio data having the maximum of 64 channels is compressed according to the MPEG audio layer II for every channel.

(2) Each channel data resulted from the above-mentioned (1) is subjected to error correction encode processing by convolution coding and interleaving of the time axis.

(3) The result of the above-mentioned (2) is multiplexed to one channel. Auxiliary data such as PAD (Program Associated Data) is added.

(4) The result of the above-mentioned (3) is subjected to interleave processing on the frequency axis and a symbol for synchronization is added simultaneously.

(5) The result of the above-mentioned (4) is subjected to OFDM processing (Orthogonal Frequency Division Multiplex) and subsequently subjected to D/A conversion.

(6) The main carrier signal is subjected to QPSK modulation (Quadrature Phase Shift Keying) depending on the result of the above-mentioned (5), and the QPSK signal is transmitted.

The DAB is broadcast using the first frequency band and the second frequency band, which are different in frequency each other, namely VHF band (frequency band range from 174.928 to 239.2 MHz) and L band (frequency band range from 1452.96 to 1490.624 MHz).

Therefore, a DAB receiving apparatus may have the structure, for example, as shown in FIG. 1.

In FIG. 1, when a DAB of VHF band, namely the first frequency band, is received, the broadcast wave signal is received by an antenna 11, the received signal is supplied to a first mixer circuit 15 through a signal line comprising a tuning circuit 12, a high frequency amplifier 13, and a tuning circuit 14 arranged in this order, and a local oscillation signal S16 is supplied from a local oscillation circuit 16 to the mixer circuit 15.

In this case, the tuning frequency of tuning circuits 12 and 14 is changed in a frequency range from 174.928 to 239.2 MHz with tuning operation by a listener. The frequency f16 of the local oscillation signal S16 is changed in a frequency range from 136.016 to 200.288 MHz with interlocking to the tuning frequency of tuning circuits 12 and 14.

Accordingly, in the mixer circuit 15, a broadcast wave signal S12 (frequency of f12) which a listener wants to receive is frequency-down-converted to a first intermediate frequency signal S15 having a frequency of f15, namely 337.408 MHz according to the equations described herein under.

$f15 = f12 - f16$ $= (174.928 \text{ to } 239.2 \text{ MHz}) - (136.016 \text{ to } 200.288 \text{ MHz})$ $= 38.912 \text{ MHz}$ The intermediate frequency signal S15 is supplied to a mixer circuit 18 through a band pass filter for intermediate frequency filter 17, a local oscillation signal S19 having a predetermined frequency of f19 (=36.864 MHz) is generated in a local oscillation circuit 19, and the local oscillation signal S19 is supplied to the mixer circuit 18.

As described herein above, the intermediate frequency signal S15 is frequency-down-converted to an intermediate frequency signal S18 having frequency f18 of 2.048 MHz according to the equations described herein under.

$f18 = f15 - f19$ $= 38.912 \text{ MHz} - 36.864 \text{ MHz}$ $= 2.048 \text{ MHz}$ The intermediate frequency signal S18 is supplied to an A/D converter circuit 23 through a band pass filter for intermediate frequency filter 21 and an amplifier for intermediate frequency amplification 22 for A/D conversion to a digital intermediate frequency signal, the signal is supplied to an orthogonal demodulation circuit 24 and I-component data and Q-component data are digital-demodulated.

Further, these data are supplied to an FFT (Fast Fourier Transform) circuit 25 for OFDM demodulation, the OFDM demodulated data are supplied to a Viterbi decoder circuit 26 for deinterleaving and error correction, and a program (channel) is selected in the Viterbi decoder circuit 26 and thus a digital audio data of the desired program is selected.

Subsequently, the selected data is supplied to a data expansion circuit 27 for performing MPEG data expansion, and a digital audio data expanded to the original data length is outputted from the data expansion circuit 27, the outputted digital audio data is supplied to a D/A converter circuit 28 for D/A conversion to an analog audio signal, and the signal is outputted to terminals 29.

On the other hand, when L band DAB, namely the second frequency band, is received, the broadcast wave signal S32 is received by an antenna 31, the received signal S32 is supplied to a mixer circuit 35 through a signal line comprising a band pass filter 32, a high frequency amplifier 33, and a band pass filter 34 arranged in this order, and a local oscillation signal S36 having a predetermined frequency f36 is supplied from a local oscillation circuit 36 to the mixer circuit 35.

In this case, the band pass filters 32 and 34 have a passing L band frequency range from 1452.96 to 1490.624 MHz. The frequency f36 of the local oscillation signal S36 remains 1251.424 MHz regardless of the received frequency.

In the mixer circuit 35, the L band broadcast wave signal S32 is frequency-converted to an intermediate frequency signal S35 having a frequency f35 by down-conversion according to the equations described herein under.

$f35 = f32 - f36$ $= (1452.96 \text{ to } 1490.624 \text{ MHz}) - 1251.424 \text{ MHz}$ $= 201.536 \text{ to } 239.2 \text{ MHz}$ The intermediate frequency signal S35 is supplied to the tuning circuit 14 through a band pass filter for intermediate frequency filtration 37 and an amplifier for intermediate frequency amplification 38. In this case, the tuning frequency f14 of the tuning circuit 14 is changed correspondingly to a broadcast wave signal which a listener wants to receive out of L band broadcast wave signals, and the oscillation frequency f16 of the local oscillation circuit 16 is changed in a frequency range from 162.624 to 200.288 MHz correspondingly to the tuning frequency f14 of the tuning circuit 14.

Accordingly, in the mixer circuit 15, the intermediate frequency signal S14 of a broadcast wave signal which a listener want to receive is frequency-converted to an intermediate frequency signal S15 having a frequency f15 according to the equations described herein under.

f15=f14−f16
=(201.536 to 239.2 MHz)−(162.624 to 200.288 MHz)
=38.912 MHz

The intermediate frequency signal S15 is processed in the band pass filter 17 and subsequent circuits in the same manner as described for the VHF band processing, and L band DAB audio signal is outputted to terminals 29.

The outline of a receiving apparatus which receives VHF band and L band DAB is described herein above.

FIG. 2 shows a detailed example of local oscillation circuits 16, 19, and 36, the example comprises a PLL, further in this example, a variable frequency division circuit of the PLL comprises a pulse swallow type counter.

In detail, the pulse swallow type counter 42 comprises a prescaler 42P, a main counter 42M, and swallow counter 42S. An oscillation signal of the VCO 41 is divided into a predetermined frequency by the prescaler 42P and main counter 42M, and then supplied to a phase comparison circuit 43. A reference frequency signal is supplied from a generation circuit 44 to the comparison circuit 43. A comparison output of the comparison circuit 43 is supplied to the VCO 41 through a loop filter 45 as a control signal.

Further, when the PLL is used as the local oscillation circuit 16, the frequency division ratio of the main counter 42M is changed correspondingly to the received frequency, and on the other hand, when the PLL is used as the local oscillation circuits 19 and 36, the frequency division ratio of the main counter is fixed. An oscillation signal of the VCO 41 is supplied to mixer circuits 15 and 18, or 35 as local oscillation signals S16 and S19, or S36.

A receiving apparatus for receiving VHF band and L band DAB is structured as described herein above, the above-mentioned receiving apparatus requires, for example, three PLLs as described in FIG. 2 as local oscillation circuits 16, 19, and 36 to result in increased circuit scale, and the requirement prevents a receiving apparatus to be made small-sized and leads to increased power consumption on the same reason.

Further as shown in FIG. 3, in VHF band, the frequency of the received signal S12 ranges from 174.928 to 239.2 MHz, and the frequency of the local oscillation signal S16 ranges from 136.016 to 200 288 MHz. Because the received signal S12 is down converted to the intermediate frequency signal S15 using the local oscillation signal S16, the image frequency fimg is changed to range from 97.104 to 161.376 MHz, the change brings the image frequency fimg closer to the frequency band of the received signal S12. Therefore, the image disturbance removal performance becomes poor unless tuning circuits 12 and 14 having high Q are used to obtain sufficient attenuation performance for the image frequency fimg.

However, to have high Q, a coil and variable capacity diode having high Q are required to structure tuning circuits 12 and 14, or alternatively tuning circuits 12 and 14 having a multi-stage structure or double tuning circuits are required. These structures prevent a receiving apparatus to be made small-sized, and leads to high cost.

The present invention is accomplished to solve problems described herein above.

Accordingly, L band and VHF band received signal is frequency-converted to a first intermediate frequency signal using an oscillation signal of the first, namely the front end, local oscillation circuit.

BRIEF DESCRIPTION OF THE DRAWINGS

FIG. 8 is a system diagram for illustrating another embodiment of the present invention.

DETAILED DESCRIPTION OF THE PREFERRED EMBODIMENTS

Figure 1:
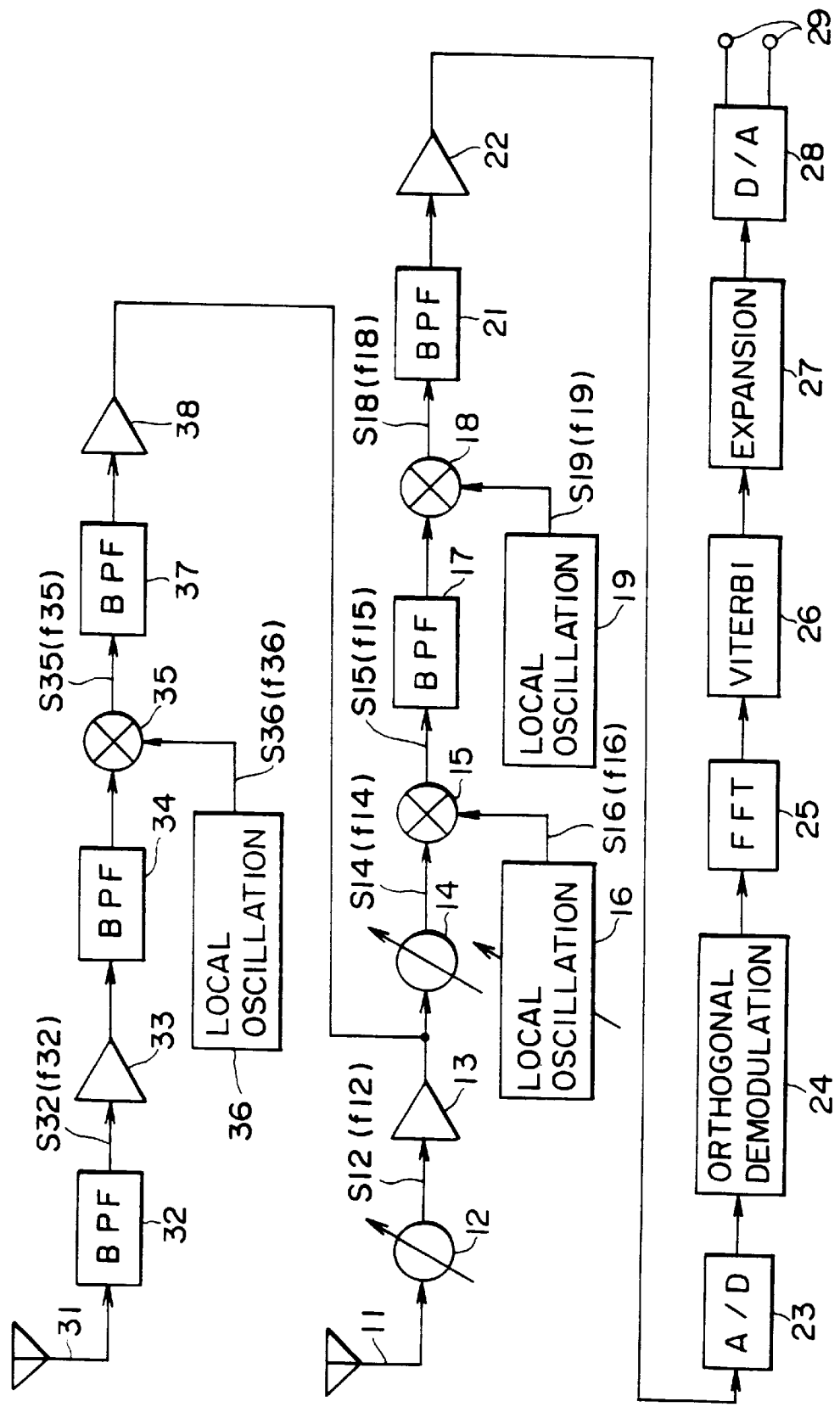
FIG. 1 is a system diagram for illustrating the Prior Art.
Figure 2:
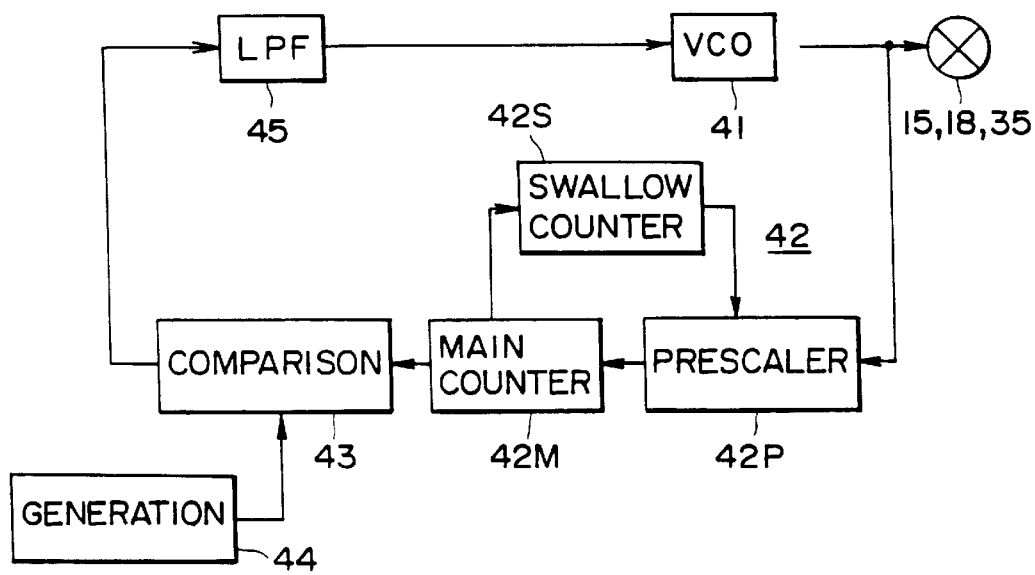
FIG. 2 is a diagram for illustrating the present invention.
Figure 3:
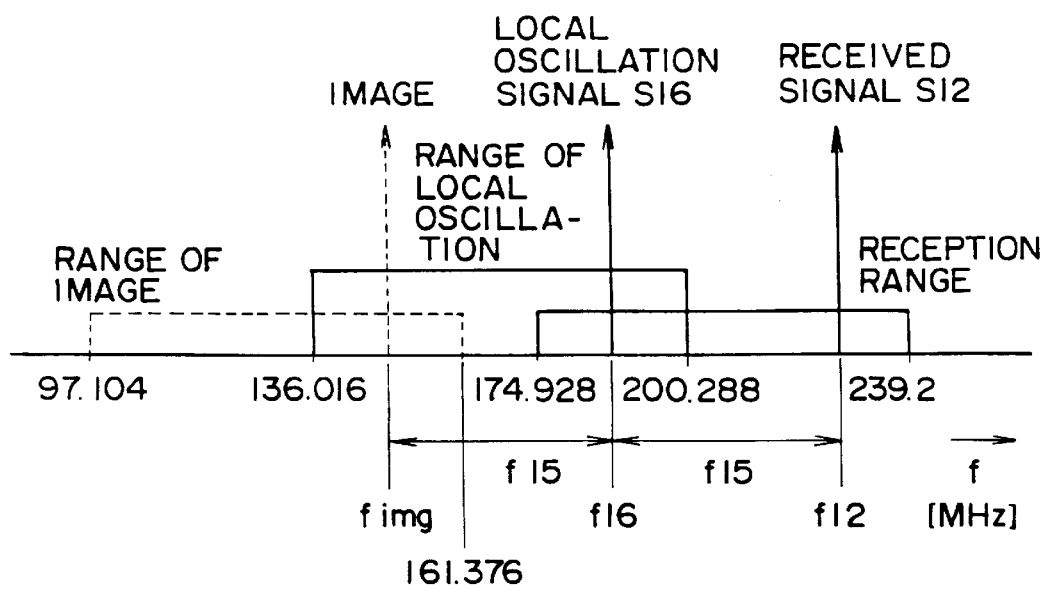
FIG. 3 is a diagram for describing the present invention.
Figure 4:
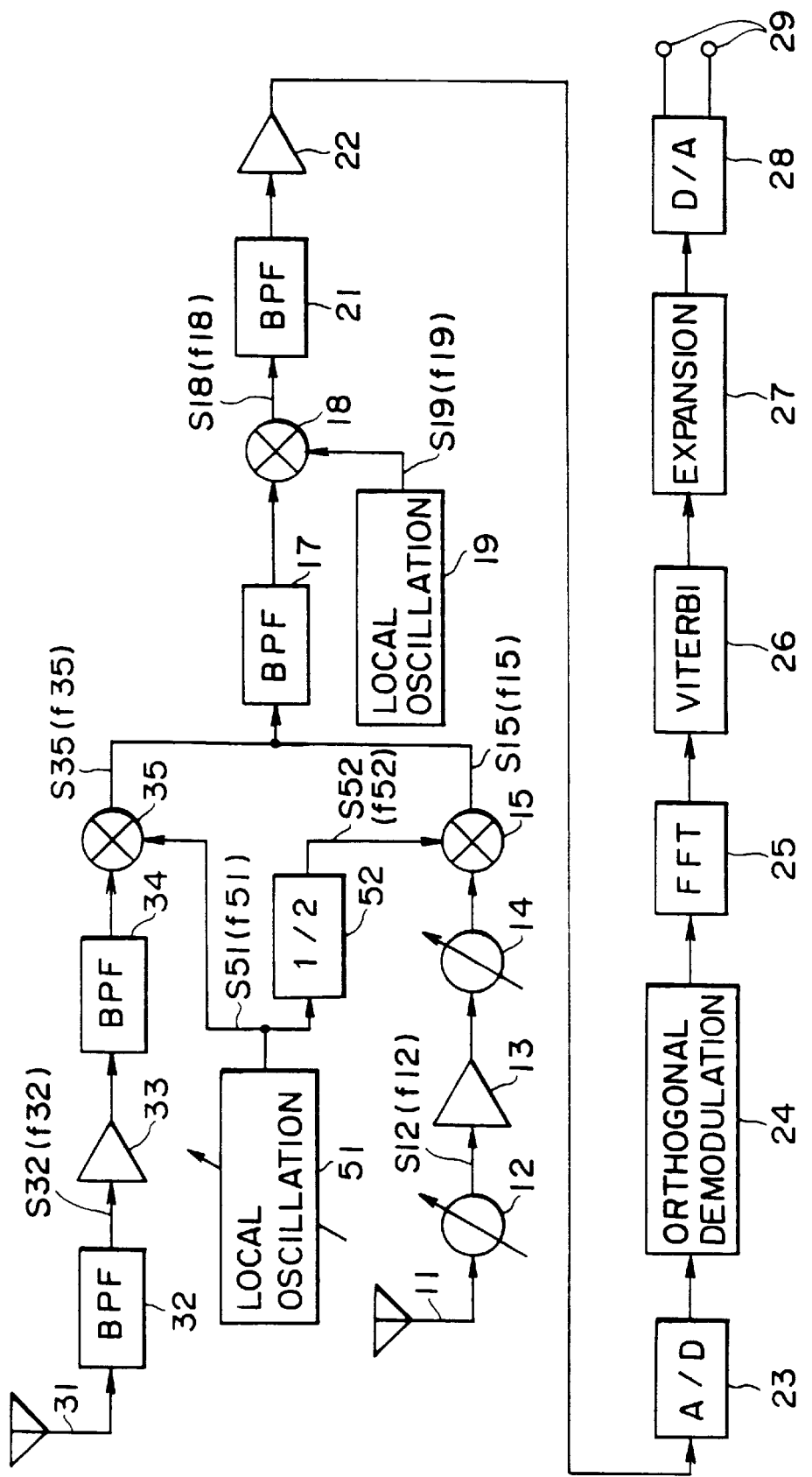
FIG. 4 is a system diagram for illustrating one embodiment of the present invention.

In FIG. 4, when a DAB of VHF band namely the first frequency band is received, the broadcast wave signal is received by an antenna 11, the received signal is supplied to a first mixer circuit 15 through a signal line comprising a tuning circuit 12, a high frequency amplifier 13, and a tuning circuit 14 arranged in this order, and a first oscillation signal S51 generated from a front end local oscillation circuit 51 is supplied to a frequency division circuit 52 where the signal is subjected to frequency division and converted to a signal S52 having a ½ frequency, and then the frequency divided signal S52 is supplied to the first mixer circuit 15 as a second local oscillation signal.

In this case, the tuning frequency of tuning circuits 12 and 14 is changed in a frequency range from 174.928 to 239.2 MHz with tuning operation by a listener. The frequency f51 of the oscillation signal S51 is changed in a frequency range from 1024.672 to 1153.216 MHz with interlocking to the tuning frequency of tuning circuits 12 and 14. As the result, the frequency f52 of the frequency divided signal S52 is also changed in a frequency range from 512.336 to 576.608 MHz with interlocking to the tuning frequency of tuning circuits 12 and 14.

Accordingly, in the first mixer circuit 15, a broadcast wave signal S12 (frequency of f12) which a listener wants to receive is frequency-up-converted to a first intermediate frequency signal S15 having a frequency of f15, namely 337.408 MHz according to the equations described herein under.

$f15=f52-f12$
=(512.336 to 576.608 MHz)−(174.928 to 239.2 MHz)
=337.408 MHz

When L band DAB namely the second frequency band is received, the broadcast wave signal S32 is received by an antenna 31, the received signal S32 is supplied to a second mixer circuit 35 through a signal line comprising a band pass filter 32, a high frequency amplifier 33, and a band pass filter 34 arranged in this order, simultaneously an oscillation signal S51 generated from the front end local oscillation circuit 51 is supplied to the second mixer circuit 35 as a first local oscillation signal.

In this case, the band pass filters 32 and 34 have a passing L band frequency range from 1452.96 to 1490.624 MHz. The frequency f51 of the local oscillation signal S51 is changed in a frequency range from 1115.552 to 1153.216 MHz with tuning operation by a listener.

Accordingly, in the mixer circuit 35, a broadcast wave signal which a listener desired to receive out of L band broadcast wave signal S32 is down-converted to a first intermediate frequency signal S35 having a frequency f35 according to the equations described herein under.

$$f35 = f32 - f51$$
$$= (1452.96 \text{ to } 1490.624 \text{ MHz}) - (1115.552 \text{ to } 1153.216 \text{ MHz})$$
$$= 337.408 \text{ MHz}$$
$$= f15$$

When VHF band is received, the first intermediate frequency signal S15 is supplied to a third mixer circuit 18 through a band pass filter for intermediate frequency filter 17, a third local oscillation signal S19 having a predetermined frequency of f19 (=335.36 MHz) is generated in a back end local oscillation circuit 19, and the local oscillation signal S19 is supplied to the third mixer circuit 18.

As described herein above, the intermediate frequency signal S15 is frequency-down-converted in the third mixer circuit 18 to a second intermediate frequency signal S18 having frequency f18 of 2.048 MHz according to the equations described herein under.

$$f18 + f15 - f19$$
$$= 337.408 \text{ MHz} - 335.36 \text{ MHz}$$
$$= 2.048 \text{ MHz}$$

The second intermediate frequency signal S18 is supplied to an A/D converter circuit 23 through a band pass filter for intermediate frequency filter 21 and an amplifier for intermediate frequency amplification 22 for A/D conversion to a digital intermediate frequency signal, the signal is supplied to an orthogonal demodulation circuit 24 and I-component data and Q-component data are digital-demodulated.

Further, these data are supplied to an FFT circuit 25 for OFDM demodulation, the OFDM demodulated data are supplied to a Viterbi decoder circuit 26 for deinterleaving and error correction, and a program (channel) is selected in the Viterbi decoder circuit 26 and thus a digital audio data of the desired program is selected.

Subsequently, the selected data is supplied to a data expansion circuit 27 for performing MPEG data expansion, and a digital audio data expanded to the original data length is outputted from the data expansion circuit 27, the outputted digital audio data is supplied to a D/A converter circuit 28 for D/A conversion to an analog audio signal, and the signal is outputted to terminals 29.

Because the L band first intermediate frequency signal S35 is equivalent to the first intermediate frequency signal S15 generated when a VHF band DAB is received, the first intermediate frequency signal S35 is supplied to the band pass filter 17 and subsequent circuits, and processed as the signal S15 generated when a VHF band DAB is received, and an audio signal originated from the L band DAB is outputted to terminals 29.

Received band switching between VHF band and L band is performed so that, for example, the power source of circuits 33 and 35 are turned off when VHF band is received and the power source of the circuits 13, 15, and 52 is turned off when L band is received.

As described herein above, DAB of VHF band and L band is received using this receiving apparatus, in this case, particularly according to the structure of the above-mentioned receiving apparatus, the circuit scale of the apparatus can be made small and a receiving apparatus is made small-sized because two local oscillation circuits 51 and 19 are sufficient for the apparatus to operate. Also power consumption can be reduced on the same reason.

Figure 5:
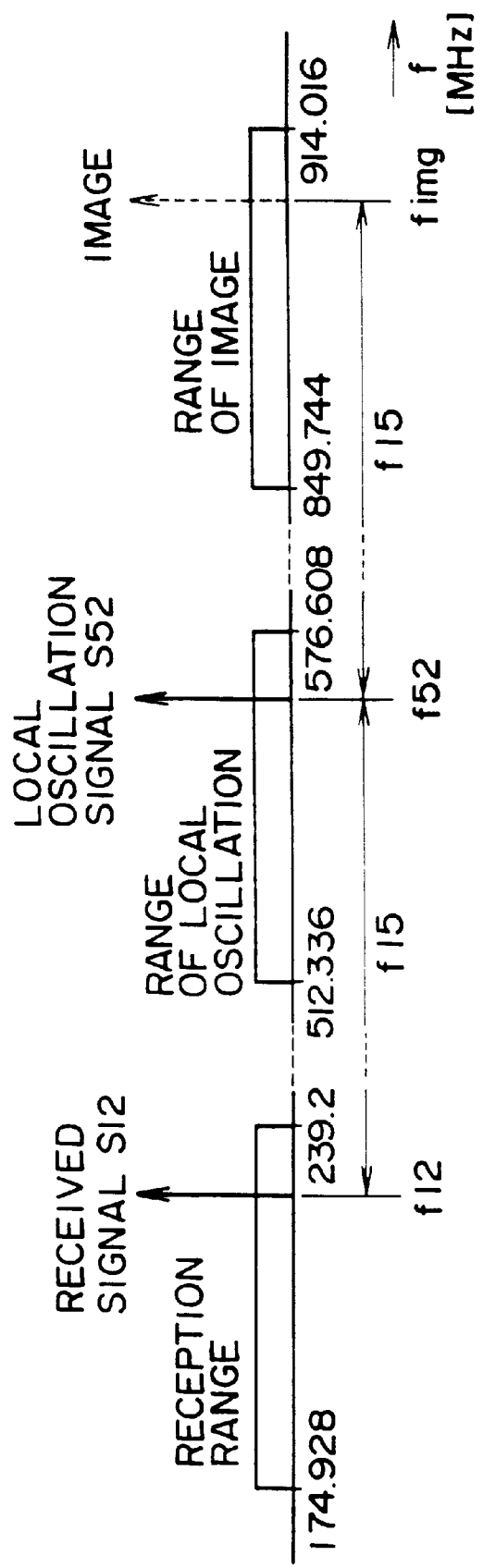
FIG. 5 is a diagram for describing the present invention.

Further as shown in FIG. 5, in VHF band, the frequency of the received signal S12 ranges from 174.928 to 239.2 MHz, and the frequency of the local oscillation signal S52 ranges from 512.336 to 576.608 MHz. Because the received signal S12 is up-converted to the first intermediate frequency signal S15 by the local oscillation signal S52, the image frequency fimg ranges from 849.744 to 914.016 MHz, the image frequency fimg is far apart from the frequency range of the received signal S12.

Accordingly, tuning circuits 12 and 14 having not so high Q are sufficient for obtaining sufficient attenuation performance for the image frequency fimg, and for obtaining good image disturbance removal performance. Incorporation of a usual pack parts such as a low pass filter comprising a coil and capacitor at the front end of the tuning circuit 12 improves image disturbance removal performance, and thus the requirement of high Q of tuning circuits 12 and 14 is relaxed. Therefore, tuning circuits 12 and 14 do not require a component coil and variable capacity diode having particularly high Q, or tuning circuits 12 and 14 can be structured simply, as the result, the advantage contributes to miniaturization of the receiving apparatus and to reduction of the cost of the receiving apparatus. Further, adjustment of tuning circuits 12 and 14 is simplified, the cost is reduced in this aspect.

Figure 6:
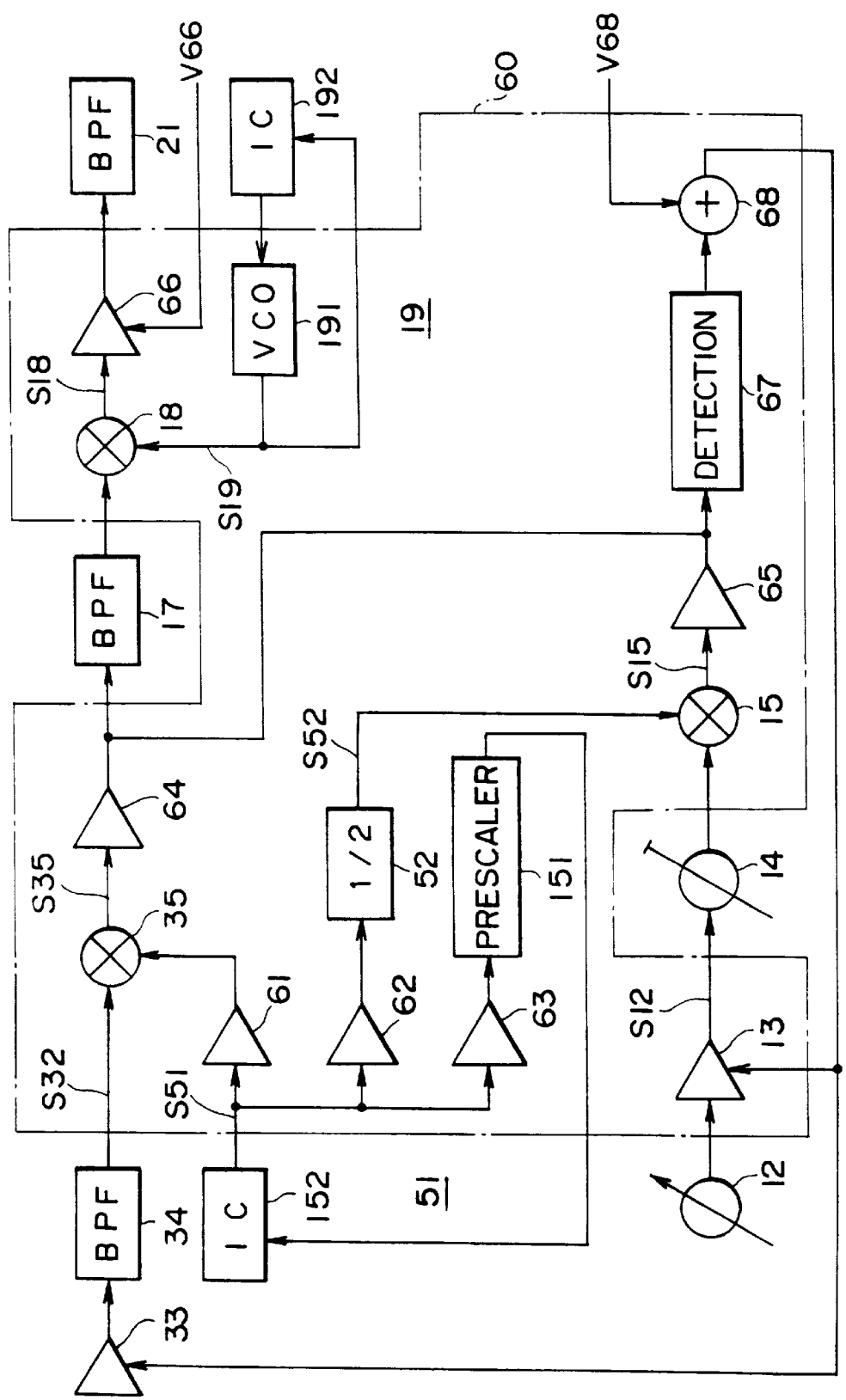
FIG. 6 is a system diagram for illustrating a part of one embodiment of the present invention.

In the example shown in FIG. 6, the analog processing portion shown in FIG. 4 is structured with an IC which employs bipolar process. In this drawing, peripheral circuits which are not incorporated in the IC is only partially shown in the drawing and the residual peripheral circuits are not shown for convenience of the space.

A portion enclosed with a dashed line shown by a character 60 is incorporated in an IC. The local oscillation circuit 51 is structured with a PLL, a prescaler 151 out of circuits which are components of the PLL (local oscillation circuit) is provided in the internal of the IC 60, and the residual circuits are incorporated in another IC 152. Further, the local oscillation circuit 19 is structured with a PLL, a VCO 191 out of circuits which are components of the PLL (local oscillation circuit) 19 is provided in the internal of the IC 60, and the residual circuits are incorporated in another IC 192.

An oscillation signal S51 is outputted from a VCO (not shown in the drawing) of the IC 152, the signal S51 is supplied to respective circuits through buffer amplifiers 61 to 63, and interference of circuit is thereby prevented. Further, the power source of the amplifier 61 is turned off when VHF band is received, and the power source of the amplifier 62 is turned off when L band is received, therefore even if the receiving band which is not selected receives a large input signal, the large signal does not affect adversely.

First intermediate frequency signals outputted from mixer circuits 35 and 15 are supplied to the next step circuits through amplifiers 64 and 65. A variable gain amplifier 66 is provided subsequent to the mixer circuit 18, an AGC voltage V66 is supplied to the amplifier 66, and the level of a signal supplied to the A/D converter circuit 23 (refer to FIG. 4) is AGC-controlled so as to match to the dynamic range of the A/D converter circuit 23.

Further, a variable gain amplifier is used as amplifiers 33 and 13, first intermediate frequency signals S35 and S15 outputted from amplifiers 64 and 65 are supplied to the level detection circuit 67 to output the detection voltage which indicates the level of first intermediate frequency signals S35 and S15, the detection voltage is supplied to amplifiers 33 and 13 through the addition circuit 68 as a gain control signal, and AGC is performed. A voltage V68 which indicates the level of I-component and Q-component of the base band is generated, the voltage V68 is also supplied to the amplifiers 33 and 13 through the addition circuit 68 as a gain control signal, and thus AGC is performed.

Figure 7:
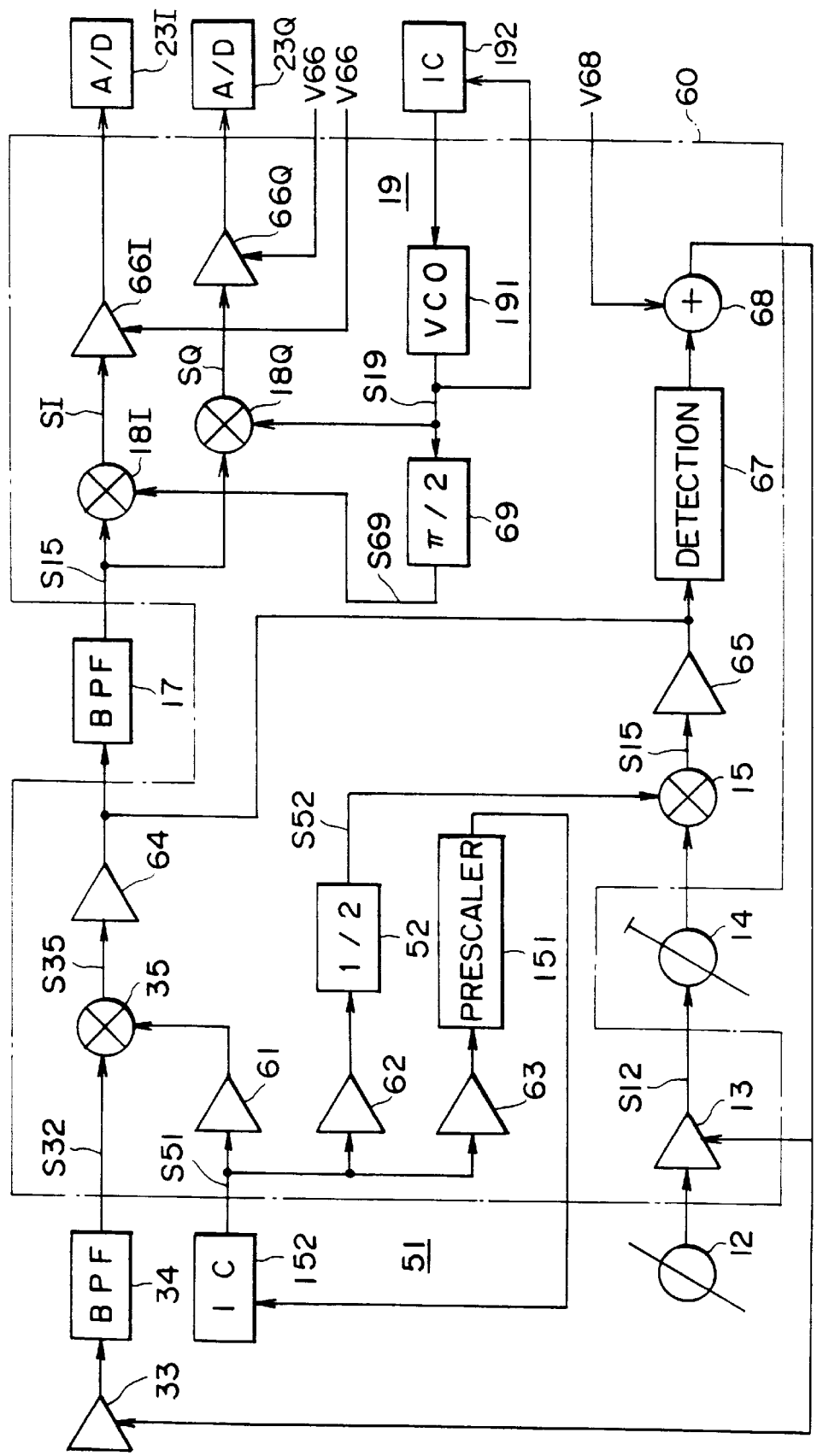
FIG. 7 is a system diagram for illustrating a part of one embodiment of the present invention.

FIG. 7 shows the case that I-component and Q-component of the base band are obtained and thereafter digital processing is performed in the IC 60. In this drawing, peripheral circuits which are not incorporated in the IC is partially not shown for the convenience of the space.

The first intermediate frequency signal S15 (S15 =S35, f15=f35=337.408 MHz) outputted from the band pass filter 17 is supplied to third mixer circuits 18I and 18Q. The oscillation frequency f19 of the VCO 191 is equalized to the first intermediate frequency f15, the oscillation signal S19 is supplied to the mixer circuit 18Q as a third local oscillation signal, the signal S19 is supplied to the phase shift circuit 69, in which the signal S19 is converted to a signal S69 having the phase different from that of the signal S19 by 90 degrees, and the signal S69 is supplied to the mixer circuit 18I.

As described herein above, the intermediate frequency signal S15 is frequency-converted to I-signal SI and Q-signal SQ of the base band, and these signals SI and SQ are outputted from mixer circuit 18I and 18Q.

Signals SI and SQ are supplied to A/D converter circuits 23I and 23Q through gain control amplifiers for level controlling 66I and 66Q, and A/D converted to digital data and these data are supplied to digital low pass filters (not shown in the drawing) for removal of garbage components, and thereafter processing by the FFT circuit 25 and subsequent processing shown in FIG. 4 are performed to output an audio signal.

When, voltages V66 and V66 which indicate the level is generated from the digital data which is generated by A/D-converting signals SI and SQ, voltages V66 and V66 control the gain of amplifiers 66I and 66Q, and the level of signals SI and SQ supplied to A/D converter circuit 23I and 23Q is controlled so as to match to the dynamic range of A/D converter circuits 23I and 23Q and AGC-controlled.

According to the structure described herein above, the band pass filter 17 is simplified and the cost is reduced.

In detail, in the IC 60 in FIG. 6, because an image signal (image frequency=f15−2·f18=333.312 MHz) is removed by the band pass filter 17, the band pass filter 17 should have steep cutoff characteristic so as to allows the frequency f15 (=337.408 MHz) to pass and to cut the image frequency near f15. However, in the IC 60 in FIG. 7, because it is not required for the band pass filter to remove the image signal, the band pass filter 17 may have moderate cutoff characteristic, hence, the band pass filter is simplified and the cost is reduced.

In the above-mentioned structure, digital processing by A/D converter circuits 23, 23I and 23Q and subsequent circuits is realized by hardware, however, alternatively realized by DSP and its software.

The frequency division circuit 52 may be served also as a part of the PLL variable frequency division circuit which is a component of the local oscillation circuit 51.

FIG. 8 shows an example in which the local oscillation signal S51 is supplied directly to the first mixer circuit 15 as it is without providing a frequency division circuit, the local oscillation signal S51 is doubled to generate a second local oscillation signal S53 through a multiplication circuit 53, and the doubled second local oscillation signal S53 is supplied to the second mixer circuit 35. In FIG. 8, the same components as used in FIG. 4 are given the same characters and detailed description is omitted. In FIG. 8, when VHF band is received, the tuning frequency of tuning circuits 12 and 14 is changed in a frequency range from 174.928 to 239.2 MHz according to tuning operation by a listener. Also the frequency f51 of the oscillation signal S51 outputted from the front end local oscillation circuit 51A is changed in a frequency range from 512.336 to 576.608 MHz with interlocking to the tuning frequency. Accordingly, in the mixer circuit 15, a broadcast wave signal S12 (frequency f12) which a listener wants to receive out of VHF band broadcast wave signals is frequency-converted to a first intermediate frequency signal S15 having a frequency f15 by up conversion according to the equations described herein under.

$f15=f51-f12$ $=(512.336 \text{ to } 576.608 \text{ MHz})-(174.928 \text{ to } 239.2 \text{ MHz})$ $=337.408 \text{ MHz}$ When L band is received, the broadcast wave signal S32 having the L passing band frequency range from 1452.96 to 1490.624 MHz is supplied to the second mixer circuit 35, and the oscillation signal S51 outputted from the front end local oscillation circuit 51A (frequency f51) is changed in a frequency range from 557.776 to 576.608 MHz according to tuning operation by a listener, the oscillation signal S51 is supplied to the multiplication circuit 53 to double the frequency of the signal S53 (frequency f53), and the doubled signal is supplied to the second mixer circuit 35 as a second local oscillation signal.

Accordingly, in the mixer circuit 35, a broadcast wave signal which a listener wants to receive out of L band broadcast wave signals S32 is frequency-converted to a first intermediate frequency signal S35 having a frequency f35 by down conversion according to the equations described herein under.

$f35=f32-f53$ $=(1452.96 \text{ to } 1490.624 \text{ MHz})-(1115.552 \text{ to } 1153.216 \text{ MHz})$ $=337.408 \text{ MHz}$ First intermediate frequency signals S15 and S35 are supplied to the band pass filter 17. Other circuits and operations in FIG. 8 are the same as those shown in FIG. 4, and finally DAB audio signal of VHF band or L band is outputted to terminals 29.

According to the present invention, because the number of local oscillation circuits can be reduced, the circuit scale is reduced and the receiving apparatus is made small-sized. Further, the power consumption is reduced on the same reason.

Because a tuning circuit having not so high Q is sufficient for obtaining the sufficient attenuation performance for the image frequency, and for obtaining good image disturbance removal performance, a coil and variable capacity diode which are component of the tuning circuit having particularly high Q are not required, or the tuning circuit may have a simple structure, as the result, the receiving apparatus is made small-sized, and the cost of the receiving apparatus is reduced. Further, adjustment of the tuning circuit is simplified and the cost is reduced in this respect.

What is claimed is:

1. A receiving apparatus for receiving digital broadcasting including a first frequency band and a second frequency band, said receiving apparatus comprising:

first local oscillation means for generating a first local oscillation signal;

frequency conversion means for generating a second local oscillation signal by frequency-converting said first local oscillation signal;

first mixer means for frequency-converting a first frequency signal of said first frequency band to a first intermediate frequency signal using one of said first local oscillation signal and said second local oscillation signal;

second mixer means for frequency-converting a second frequency signal of said second frequency band to said first intermediate frequency signal using one of said first local oscillation signal and said second local oscillation signal;

second local oscillation means for generating a third local oscillation signal; and third mixer means, wherein one of a first local oscillation signal frequency of said first local oscillation signal and a second local oscillation signal frequency of said second local oscillation signal is increased to a frequency higher than said first frequency band, and said first frequency signal of said first frequency band is frequency-converted to said first intermediate frequency signal in said first mixer means by up-conversion, the other of said first local oscillation signal frequency of said first local oscillation signal and said second local oscillation signal frequency of said second local oscillation signal is decreased to a frequency lower than said second frequency band, and said second frequency signal of said second frequency band is frequency-converted to said first intermediate frequency signal in said second mixer means by down-conversion, said first intermediate frequency signal output from said second mixer means is supplied to said third mixer means when said second frequency band is received and said first intermediate frequency signal output from said first mixer means is supplied to said third mixer means when said first frequency band is received, said first intermediate frequency signal output from one of said first mixer means and said second mixer means is frequency-converted to a second intermediate frequency signal in said third mixer means using said third local oscillation signal, a digital signal comprising an I-component and a Q-component is generated by performing A/D conversion and separation into said I-component and said Q-component on said second intermediate frequency signal, and original digital data is extracted from said digital signal comprising said I-component and said Q-component.

2. A receiving apparatus for receiving a digital broadcasting including a first frequency band and a second frequency band, said receiving apparatus comprising:

first local oscillation means for generating a first local oscillation signal;

frequency division means for generating a second local oscillation signal by frequency-dividing said first local oscillation signal;

first mixer means for frequency converting a first frequency signal of said first frequency band to a first intermediate frequency signal using said second local oscillation signal;

second mixer means for frequency-converting a second frequency signal of said second frequency band to said first intermediate frequency signal using said first local oscillation signal;

second local oscillation means for generating a third local oscillation signal; and third mixer means, wherein, a second local oscillation signal frequency of said second local oscillation signal is increased to a frequency higher than said first frequency band, and said first frequency signal of said first frequency band is frequency-converted to said first intermediate frequency signal in said first mixer means by up-conversion, a first local oscillation signal frequency of said first local oscillation signal is decreased to a frequency lower than said second frequency band, and said second frequency signal of said second frequency band is frequency-converted to said first intermediate frequency signal in said second mixer means by down-conversion, said first intermediate frequency signal output from said second mixer means is supplied to said third mixer means when said second frequency band is received and said first intermediate frequency signal output from said first mixer means is supplied to said third mixer means when said first frequency band is received, said first intermediate frequency signal output from one of said first mixer means and said second mixer means is frequency-converted to a second intermediate frequency signal in said third mixer means using said third local oscillation signal, a digital signal comprising an I-component and a Q-component is generated by performing A/D conversion and separation into said I-component and said Q-component on said second intermediate frequency signal, and original digital data is extracted from said digital signal comprising said I-component and said Q-component.

3. The receiving apparatus as set forth in claim 2, wherein said frequency division means includes means for frequency-dividing said first local oscillation signal by ½.

4. A receiving apparatus for receiving digital broadcasting including a first frequency band and a second frequency band, said receiving apparatus comprising:

first local oscillation means for generating a first local oscillation signal;

multiplication means for generating a second local oscillation signal by multiplexing said first local oscillation signal;

first mixer means for frequency-converting a first frequency signal of said first frequency band to a first intermediate frequency signal using said first local oscillation signal;

second mixer means for frequency-converting a second frequency signal of said second frequency band to said first intermediate frequency signal using said second local oscillation signal;

second local oscillation means for generating a third local oscillation signal; and third mixer means, wherein a first local oscillation signal frequency of said first local oscillation signal is increased to a frequency higher than said first frequency band, and said first frequency signal of said first frequency band is frequency-converted to said first intermediate frequency signal in said first mixer means by up-conversion, a second local oscillation signal frequency of said second local oscillation signal is decreased to a frequency lower than said second frequency band, and said second frequency signal of said second frequency band is frequency-converted to said first intermediate frequency signal in said second mixer means by down-conversion, said first intermediate frequency signal output from said second mixer means is supplied to said third mixer means when said second frequency band is received and said first intermediate frequency signal output from said first mixer means is supplied to said third mixer means when said first frequency band is received, said first intermediate frequency signal output from one of said first mixer means and said second mixer means is frequency-converted to a second intermediate frequency signal in said third mixer means using said third local oscillation signal, a digital signal comprising an I-component and a Q-component is generated by performing A/D conversion and separation into said I-component and said Q-component on said second intermediate frequency signal, and original digital data is extracted from said digital signal comprising said I-component and said Q-component.

5. The receiving apparatus as set forth in claim 4, wherein said multiplication means includes means for doubling said first local oscillation signal.

* * * * *